(12) United States Patent
Tour et al.

(10) Patent No.: US 9,831,424 B2
(45) Date of Patent: Nov. 28, 2017

(54) NANOPOROUS METAL-OXIDE MEMORY (71) Applicants: James M. Tour, Bellaire, TX (US);
Gunuk Wang, Houston, TX (US);
Yang Yang, Beijing (CN)

(72) Inventors: James M. Tour, Bellaire, TX (US);
Gunuk Wang, Houston, TX (US);
Yang Yang, Beijing (CN)

(73) Assignee: WILLIAM MARSH RICE UNIVERSITY, Houston, TX (US)

(*) Notice: Subject to any disclaimer, the term of this patent is extended or adjusted under 35 U.S.C. 154(b) by 0 days.

(21) Appl. No.: 14/809,770

(22) Filed: Jul. 27, 2015

(65) Prior Publication Data
US 2016/0028004 A1    Jan. 28, 2016

Related U.S. Application Data (60) Provisional application No. 62/029,305, filed on Jul. 25, 2014.

(51) Int. Cl.
*H01L 27/108* (2006.01)
*H01L 45/00* (2006.01)
*H01L 27/24* (2006.01)

(52) U.S. Cl.
CPC .......... *H01L 45/08* (2013.01); *H01L 27/2472* (2013.01); *H01L 45/1233* (2013.01); *H01L 45/146* (2013.01); *H01L 45/1633* (2013.01)

(58) Field of Classification Search
CPC ...... H01L 27/2463; H01L 45/08; H01L 45/16
USPC .................................................... 257/3, 310
See application file for complete search history.

(56) References Cited

U.S. PATENT DOCUMENTS

| 7,129,133 | B1* | 10/2006 | Avanzino | ............ | H01L 51/0591 |
| | | | | | 257/296 |
| 7,306,988 | B1* | 12/2007 | Avanzino | ............ | H01L 45/1608 |
| | | | | | 257/301 |
| 8,592,791 | B2 | 11/2013 | Tour et al. | | |
| 2005/0018477 | A1 | 1/2005 | Baker | | |
| 2005/0019975 | A1 | 1/2005 | Lee et al. | | |

(Continued)

FOREIGN PATENT DOCUMENTS

WO    WO-2012112769 A1    8/2012
WO    WO-2013032983 A1    3/2013

(Continued)

OTHER PUBLICATIONS

International Technology Roadmap for Semiconductors: ITRS 2013 Edition—Emerging Research Devices; http://www.itrs.net/Links/2013ITRS/Home2013.htm.

(Continued)

*Primary Examiner* — Long K Tran
(74) *Attorney, Agent, or Firm* — Winstead PC (57) ABSTRACT

A nanoporous (NP) memory may include a non-porous layer and a nanoporous layer sandwiched between the bottom and top electrodes. The memory may be free of diodes, selectors, and/or transistors that may be necessary in other memories to mitigate crosstalk. The nanoporous material of the nanoporous layer may be a metal oxide, metal chalcogenide, or a combination thereof. Further, the memory may lack any additional components. Further, the memory may be free from requiring an electroformation process to allow switching between ON/OFF states.

13 Claims, 7 Drawing Sheets

(56) References Cited

U.S. PATENT DOCUMENTS

| | | | |
|---|---|---|---|
| 2005/0285095 A1* | 12/2005 | Happ | B82Y 10/00 257/2 |
| 2006/0046379 A1* | 3/2006 | Symanczyk | H01L 45/06 438/238 |
| 2006/0249777 A1 | 11/2006 | Forbes et al. | |
| 2008/0296550 A1 | 12/2008 | Lee et al. | |
| 2010/0117051 A1* | 5/2010 | Tian | H01L 21/76802 257/4 |
| 2011/0035535 A1 | 2/2011 | Locasio et al. | |
| 2012/0049149 A1 | 3/2012 | Lu et al. | |
| 2012/0113706 A1* | 5/2012 | Williams | G11C 13/0007 365/148 |
| 2013/0069030 A1 | 3/2013 | Wells et al. | |
| 2013/0075685 A1 | 3/2013 | Li et al. | |
| 2013/0126818 A1 | 5/2013 | Chin et al. | |
| 2014/0048799 A1 | 2/2014 | Tour et al. | |
| 2014/0151228 A1* | 6/2014 | Royyuru | B82Y 15/00 204/451 |
| 2015/0147865 A1* | 5/2015 | Kuse | H01L 45/1253 438/382 |
| 2015/0162381 A1 | 6/2015 | Tour et al. | |

FOREIGN PATENT DOCUMENTS

| | | |
|---|---|---|
| WO | WO-2013134757 A1 | 9/2013 |
| WO | WO-2015077281 A1 | 5/2015 |

OTHER PUBLICATIONS

R. Waser, et al. Adv. Mater. 2009, 21, 2632-2663.
H. F. Hamann, et al. Nat. Mater. 2006, 5, 383-387.
Sawa, Materials Today 2008, 11, 28-36.
J. J. Yang, et al. Nat. Nanotech. 2013, 8, 13-24.
R. Waser, et al. Nat. Mater. 2007, 6, 833-840.
M. J. Lee, et al. Nat. Mater. 2011, 10, 625-630.
M. J. Lee, et al. Adv. Mater. 2007, 19, 73-76.
S. H. Chang, et al. Adv. Mater. 2011, 23, 4063-4067.
E. Linn, R. Rosezin, C. Kugeler, R. Waser, Nature Mater. 2010, 9, 403-406.
J. W. Seo et al. Appl. Phys. Lett. 2011, 98, 233505-233503.
B. Cho et al. Adv. Mater. 2010, 22, 1228-1232.
G. H. Kim et al. Adv. Funct. Mater. doi:10.1002/adfm.201202170, 2012.
M.-J. Lee et al. Adv. Funct. Mater. 2009, 19, 1587-1593.
Z.-J. Liu, J.-Y. Gan, T.-R. Yew, Appl. Phys. Lett. 2012, 100, 153503-153504.
S. Kim, H. Y. Jeong, S. K. Kim, S.-Y. Choi, K. J. Lee, Nano Lett. 2011, 11, 5438-5442.
T. W. Kim et al. Adv. Mater. 2009, 21, 2497-2500.
K. Kinoshita et al. Appl. Phys. Lett. 2008, 93, 033506-033503.
W. Lee et al. ACS Nano 2012, 6, 8166-8172.
H. Jiun-Jia, et al. IEEE International Electron Devices Meeting (IEDM). 2011, 31.37.31-31.37.34.
K. Beomyong, et al. Japanese Journal of Applied Physics 2013, 52, 04CD05.
J. Woo, et al. Microelectronic Engineering 2013, 109, 360-363.
L. Joonmyoung, et al 2010 IEEE International Electron Devices Meeting (IEDM), 2010, pp. 19.5.1-19.5.4.
Lee, M. J.; Seo, S.; Kim, D. C.; Ahn, S. E.; Seo, D. H.; Yoo, I. K.; Baek, I. G.; Kim, D. S.; Byun, I. S.; Kim, S. H.; Hwang, I. R.; Kim, J. S.; Jeon, S. H.; Park, B. H. Adv. Mater. 2007, 19, 73-76.
Li Y.; Lv, H.; Liu, Q.; Long, S.; Wang, M.; Xie, H.; Zhang, K.; Huo, Z.; Liu, M. Nanoscale 2013, 5, 4785-4789.
Ji Y.; Zeigler, D. F.; Lee, D. S.; Choi, H.; Jen, A. K. Y.; Ko, H. C.; Kim, T.-W. Nat. Commun. 2013, 4:2707 doi: 10.1038/ncomms3707.
Lee, M.-J.; Kim, S. I.; Lee, C. B.; Yin, H.; Ahn, S.-E.; Kang, B. S.; Kim, K. H.; Park, J. C.; Kim, C. J.; Song, I.; Kim, S. W.; Stefanovich, G.; Lee, J. H.; Chung, S. J.; Kim, Y. H.; Park, Y. Adv. Funct. Mater. 2009, 19, 1587-1593.
Lee, D.-Y.; Tsai, T.-L.; Tseng, T.-Y. Appl. Phys. Lett. 2013, 103, 032905-032905-4.
Shin, J.; Choi, G.; Woo, J.; Park, J.; Park, S.; Lee, W.; Kim, S.; Son, M.; Hwang, H. Microelectronic Engineering 2012, 93, 81-84.
Myungwoo, S.; Joonmyoung, L.; Jubong, P.; Jungho, S.; Godeuni, C.; Seungjae, J.; Wootae, L.; Seonghyun, K.; Sangsu, P.; Hyunsang, H. IEEE Elect. Dev. Lett. 2011, 32, 1579-1581.
Bae, Y. C.; Lee, A. R.; Lee, J. B.; Koo, J. H.; Kwon, K. C.; Park, J. G.; Im, H. S.; Hong, J. P. Adv. Funct. Mater. 2012, 22, 709-716.
Yang, C.; Yi, W.; Takei, K.; Hong-Yu, C.; Shimeng, Y.; Chan, P. C. H.; Javey, A.; Wong, H. S. P. IEEE Trans. Electron Devices, 2011, 58, 3933-3939.
Yang, J. J.; Pickett, M. D.; Li, X.; Ohlberg Douglas, A. A.; Stewart, D. R.; Williams, R. S. Nat. Nano. 2008, 3, 429-433.
Kwon, D.-H.; Kim, K. M.; Jang, J. H.; Jeon, J. M.; Lee, M. H.; Kim, G. H.; Li, X.-S.; Park, G.-S.; Lee, B.; Han, S.; Kim, M.; Hwang, C. S. Nat. Nano. 2010, 5, 148-153.
Jo, S. H.; Lu, W. Nano Letters 2008, 8, 392-397.
Kim, G. H.; Lee, J. H.; Ahn, Y.; Jeon, W.; Song, S. J.; Seok, J. Y.; Yoon, J. H.; Yoon, K. J.; Park, T. J.; Hwang, C. S. Adv. Funct. Mater. 2013, 23, 1440-1449.
Wang, G.; Lauchner, A. C.; Lin, J.; Natelson, D.; Palem, K. V.; Tour, J. M. Adv. Mater. 2013, 25, 4789-4793.
Lee, M.-J.; Lee, D.; Cho, S.-H.; Hur, J.-H.; Lee, S.-M.; Seo, D. H.; Kim, D.-S.; Yang, M.-S.; Lee, S.; Hwang, E.; Uddin, M. R.; Kim, H.; Chung, U. I.; Park, Y.; Yoo, I.-K. Nat. Commun. 2013, 4:2629 doi:10.1038/ncomms3629.
Lee, A. R.; Bae, Y. C.; Im, H. S.; Hong, J. P. App. Surf. Sci. 2013, 274, 85-88.
Xinjun, L.; Sadaf, S. M.; Sangsu, P.; Seonghyun, K.; Euijun, C.; Daeseok, L.; Gun-Young, J.; Hyunsang, H. IEEE Elec. Dev. Lett. 2013, 34, 235-237.
Yu, S.; Chen, H.-Y.; Gao, B.; Kang, J.; Wong, H. S. P. ACS Nano 2013, 7, 2320-2325.
Chun-Li, L.; Tuo-Hung, H.; Mei-Chin, C.; Jiun-Jia, H. IEEE Trans. Electron Devices, 2013, 60, 420-426.
Seok, J. Y.; Song, S. J.; Yoon, J. H.; Yoon, K. J.; Park, T. H.; Kwon, D. E.; Lim, H.; Kim, G. H.; Jeong, D. S.; Hwang, C. S. Adv. Funct. Mater. 2014, 24, 5316-5339.
Yang, Y.; Lee, J.; Lee, S.; Liu, C.-H.; Zhong, Z.; Lu, W. Adv. Mater. 2014, 26, 3693-3699.
Kim, K.-H.; Jo, S. H.; Gaba, S.; Lu, W. Appl. Phys. Lett. 2010, 96, 053106-053103.
Zhuo, V. Y.-Q.; Jiang, Y.; Li, M. H.; Chua, E. K.; Zhang, Z.; Pan, J. S.; Zhao, R.; Shi, L. P.; Chong, T. C.; Robertson, J. Appl. Phys. Lett. 2013, 102, 062106.
Wang, G.; Kim, Y.; Choe, M.; Kim, T.-W.; Lee, T. Adv. Mater. 2011, 23, 755-760.
Moo, J.; Awaludin, Z.; Okajima, T.; Ohsaka, T. J Solid State Electrochem 2013, 17, 3115-3123.
Yang, Y.; Choi, S.; Lu, W. Nano Letters 2013, 13, 2908-2915.
Lee, S.; Woo, J.; Lee, D.; Cha, E.; Park, J.; Moon, K.; Song, J.; Koo, Y.; Hwang, H. Appl. Phys. Lett. 2014, 104, 052108.
Wang, G., et al., Nanoporous Silicon Oxide Memory, Nano Lett. 2014, 14,4694-4699.
Liao et al., Via Diode in Cu Backend Process for 3D Cross-Point RRAM Arrays, Journal of the Electron Devices Society, vol. 2, No. 6, Nov. 2014.

\* cited by examiner

NANOPOROUS METAL-OXIDE MEMORY

RELATED APPLICATIONS

This application claims the benefit of U.S. Provisional Patent Application No. 62/029,305, filed on Jul. 25, 2014, which is incorporated herein by reference.

FIELD OF THE INVENTION

This invention relates to nanoporous metal-oxide memories and methods for manufacturing such memories.

BACKGROUND OF INVENTION

The interest in nonvolatile resistive oxide-based memories is grounded in the fact that such memories can offer outstanding switching performances, including faster switching speed, lower energy consumption per bit, lower manufacturing cost, and higher endurance, as well as the potential for scalability to high-density when compared to traditional Si-based memories. By exploiting oxide-based materials, a variety of integrated architectures for a high-density array have been suggested, such as one-diode-one-resistor (1D-1R), one-selector-one-resistor (1S-1R), complementary resistive switch (CRS), and three-dimensional (3D) cross-point arrays. In fact, the integration of these architectures is important for a crossbar array in order to eliminate undesirable misreading of the switching states. This occurs on the selected cell by parasitic sneak current through unselected cells, which is called crosstalk. Many architectures show the crosstalk problems at a crossbar array over 1 Mbit in density. For example, when the number of word/bit lines in the crossbar array is increased, the sneak current through the unselected cells and its paths are simultaneously increased, and they can then interrupt the reading process at a selected cell at a certain number of arrays. Under these circumstances, the maximum size of the array is strictly limited. Furthermore, the fabrication of the suggested architectures often requires many prerequisite high temperature processing steps such as deposition or annealing, which could lead to high cost and low device yields. Another important consideration is that the operating I-V of the diode or selector device must be matched to the operating range of the memory device, which can limit the number of materials available.

Recently, as an effort to mitigate these issues, diverse selector-less resistive memories that show a self-embedded nonlinear I-V characteristic have been suggested and investigated. However, they still suffer from inefficient non-linearity values that limit the maximum number of word/bit lines in the integrated array. In addition, many of these resistive memories require multiple oxide layers. If the stoichiometry of the active materials is not tightly controlled there could be switching non-uniformity.

In order to resolve the aforementioned issues and limitations, current strategies for making memory devices with a crossbar structure need to be improved and modified.

SUMMARY OF INVENTION

In one embodiment, a nanoporous (NP) memory includes a substrate, bottom electrode, and top electrode. Further, a non-porous layer and a nanoporous (NP) layer are sandwiched between the bottom and top electrodes. The memory may be free of diodes, selectors, and/or transistors. The nanoporous material may be a metal oxide, metal chalcogenide, or a combination thereof. As a nonlimiting example, the nanoporous material may be tantalum oxide or $Ta_2O_{5-x}$ where x is between 0-5. In some embodiments, the memory may lack any additional components or may only consist of the substrate, bottom and top electrodes, non-porous layer, and NP layer. Further, the memory may be free from requiring an electroformation process to allow switching between ON/OFF states.

In another embodiment, a memory may be formed by depositing a bottom electrode (BE) on a substrate, and depositing non-porous layer on the bottom electrode. The method may also include forming a nanoporous (NP) layer from a portion of the non-porous layer utilizing an electroformation process, which may be performed by exposing an acid and applying a voltage to the non-porous layer. Next, a top electrode (TE) may be deposited on the NP layer. The memory formed may be free of diodes, selectors, and/or transistors. The nanoporous material may be a metal oxide, metal chalcogenide, or a combination thereof. As a nonlimiting example, the nanoporous material may be tantalum oxide or $Ta_2O_{5-x}$. In some embodiments, the memory may lack any additional components or may only consist of the substrate, bottom and top electrodes, non-porous layer, and NP layer. Further, the memory may be free from requiring an electroformation process to allow switching between ON/OFF states.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 7A-7C show (a) representative I-V characteristics of a NP device with different set voltages, (b) ON/OFF ratio and (c) ON power as a function of different set voltages;

DETAILED DESCRIPTION

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. In contrast, the use of the term "consisting," as well as other forms, shall be understood to be limiting to only the elements or components recited. Also, terms such as "element" or "component" encompass both elements or components comprising one unit and elements or components that comprise more than one unit unless specifically stated otherwise.

Oxide-based resistive memory systems have high near-term promise for use in future nonvolatile memory. In some embodiments, the memory systems may contain a nanoporous metal oxide or nanoporous metal chalcogenide. In some embodiments, the memory systems include nanoporous tantalum oxide. In some embodiments, the nanoporous tantalum oxide includes $Ta_2O_{5-x}$ where x is between 0-5, TaO, or $TaO_x$. In some embodiments, the memory systems may include a substrate, top electrode (TE), a interlayer (IL), a bottom electrode (BE), and a nanoporous (NP) metal oxide or metal chalcogenide layer and non-porous layer between the electrodes. In some embodiments, the interlayer may prevent the penetration of the top electrode into the nanopore regions and may be a single layer of graphene or multilayer of graphene. In some embodiments, the non-porous layer may be tantalum. In some embodiments, the memory cell lacks any additional components, or a memory cell shall consist of only the substrate, TE, IL, BE, NP layer, and non-porous layer. For instance, in some embodiments, the memory cell lack or are free of any diodes, selectors, and/or transistors.

In some embodiments, a memory system employing a three-dimensional (3-D) networked nanoporous (NP) $Ta_2O_{5-x}$ structure and graphene for ultrahigh density storage. Result have shown that such devices may exhibit a self-embedded highly nonlinear I-V switching behaviour with an extremely low leakage current (on the order of pA) and good endurance. Calculations indicated that this memory architecture could be scaled up to a ~162 Gbit crossbar array without the need for selectors and/or diodes normally used in crossbar arrays. In some embodiments, the memory system may be a crossbar array. In some embodiments, the memory system may be an array scaled to ultrahigh densities, such as approximately 162 Gbit. In some embodiments, the memory system may be an array providing densities of 100 or greater. In addition, it was demonstrated that the voltage point for a minimum current is systematically controlled by the applied set voltage, thereby offering a broad range of switching characteristics. The potential switching mechanism is suggested based upon the transformation from Schottky to Ohmic-like contacts, and vice versa, depending on the movement of oxygen vacancies at the interfaces induced by the voltage polarity, and the formation of oxygen ions in the pores by the electric field.

In some embodiments, the memory system may provide nanoporous tantalum oxides or metal chalcogenides that are in the form of layers. Additional embodiments may pertain to methods of making memory systems by utilizing nanoporous metal oxides or metal chalcogenides (e.g., nanoporous tantalum oxides ($Ta_2O_{5-x}$)).

In some embodiments, the use of a nanoporous tantalum oxide ($Ta_2O_{5-x}$) is proposed for making memory systems. In some embodiments, the nanoporous $Ta_2O_{5-x}$ memory system adopts a layered structure with the $Ta_2O_{5-x}$ layer sandwiched between the top electrode (TE) and bottom electrode (BE). In some embodiments, the oxygen vacancies in the $Ta_2O_{5-x}$ layer are gradually increased when the layer is close to the BE. In some embodiments, the oxygen vacancies in the metal oxide layer or chalcogenide vacancies in the metal chalcogenide gradually increases when as the layer approaches the BE.

In some embodiments, a moderate (e.g. 10V or less) voltage pulse at positive and negative polarity will set/write a unit containing the memory systems into a low-resistance (ON) state and reset/erase the unit to a high-resistance (OFF) state, respectively. Further, in some embodiments, these low/high-resistance states are free from the need for an electroforming process or may occur without any electroforming process. In some embodiments, these resistance states can serve as the binary codes 0 and 1 in digital information. Once programmed, the resistance states (both ON and OFF states) are nonvolatile and nondestructive.

The switching behavior is a switchable diode property and it has a low current in the low bias region, which is similar to the 1S-1R and the CRS integration structures. However, in some embodiments of the memory systems, they do not need any additional diodes, selectors, and/or transistors in the crossbar structure for the individual nanoporous structure(s).

In some embodiments, the metal oxide or nanoporous metal chalcogenide memory systems (e.g., nanoporous tantalum oxide ($Ta_2O_{5-x}$) memory systems) can be used for the fabrication of stable two-terminal nonvolatile memories for simple integration structures that eliminate or substantially reduce crosstalk signals. In some embodiments, the memory systems are forming-free (or do not require an electroforming process), diode-free and selector-free. In some embodiments, the memory systems are stackable memories with 3-dimensional structures with a relatively high ON-OFF ratio, as compared to similar non-porous metal-oxide structures with low power properties.

Advantages of the nanoporous metal oxide and metal chalcogenide memory systems as compared to the traditional (non-porous) $Ta_2O_{5-x}$ memory systems are discussed herein. Reference is made to nanoporous tantalum oxide ($Ta_2O_{5-x}$) memory systems. However, it is believed that such advantages also apply to other nanoporous metal oxide and metal chalcogenide memory systems.

Figure 1A:
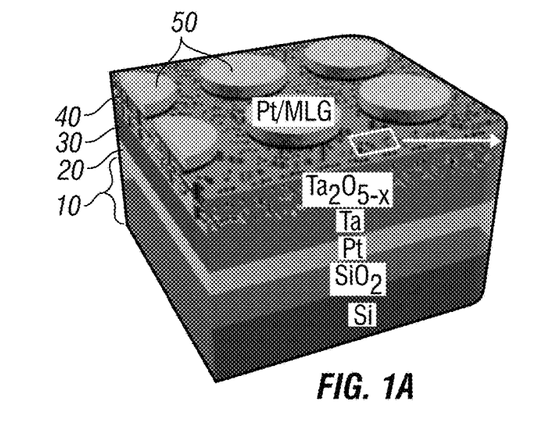
FIGS. 1A-1C show an illustrative example of (a) a nanoporous (NP) memory, (b) SEM image of the porous layer, and (c) I-V switching behaving of a NP memory.
Figure 1B:
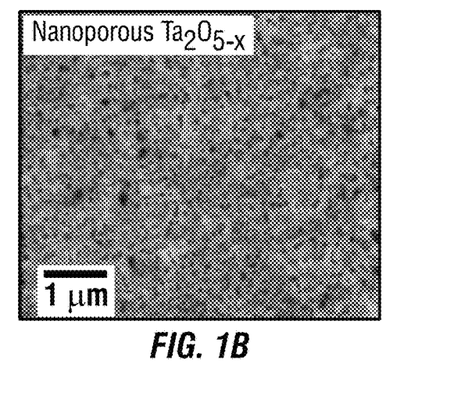
Figure 1C:
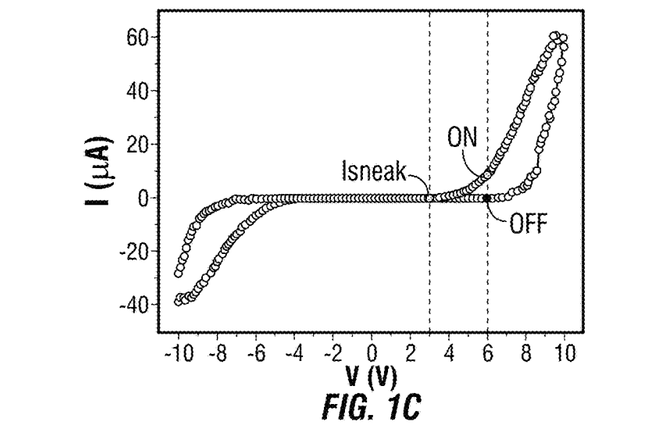

In some embodiments, the switching of nanoporous $Ta_2O_{5-x}$ memory systems have initially embedded in them the "threshold switch or selector" property, which can potentially eliminate or minimize the sneak current through neighboring cells in the crossbar structure (FIG. 1). As compared to other integration structures, such as 1D-1R, 1S-1R, 1T-1R, and CRS, the fabrication of the nanoporous $Ta_2O_{5-x}$ memory system is simpler and can be completed at room temperature. In addition, nanoporous $Ta_2O_{5-x}$ memory cells have the potential to be extended into a stackable structure using simpler processing than used for other devices.

In some embodiments, the nanoporous $Ta_2O_{5-x}$ memory systems can have reduced switching current because of the presence of oxygen or other reactive gas species in the pores that can trap charges, thereby leading to a reduction of the overall switching current. In some embodiments, the high resistance values (for the ON and OFF states) of the channel may be desirable to be formed in the nanoscale crossbar structure since the high resistance of metal nanowires at few tens of nanoscale (bit or read lines) could significantly affect the reading, writing, and/or erasing process due to the partial voltage drop of the metal lines.

Figure 2:
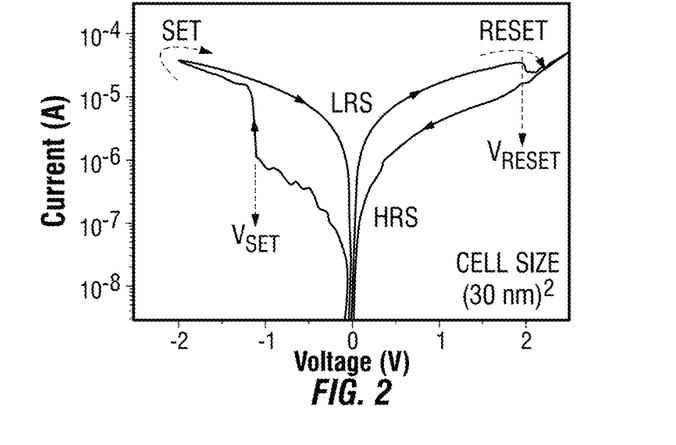
FIG. 2 shows bipolar I-V switching of a non-porous memory.

In some embodiments, the nanoporous $Ta_2O_{5-x}$ memory systems have a relatively higher ON-OFF ratio than that of a non-porous memory (FIG. 2). Normally, the bipolar $Ta_2O_{5-x}/TaO_{2-y}$ memory has five-fold difference between the ON and OFF current levels while the system here can show ON and OFF ratios with a factor of 10 or greater. In some embodiments, the system has ON and OFF ratios with a factor of 5 or greater. In some embodiments, the system has ON and OFF ratios with a factor of 10 or greater. In some embodiments, $R_{on}$ is equal to or greater than $10^4$ or $R_{off}$ is equal to or greater than $10^5$. In some embodiments, $R_{on}$ is equal to or greater than $10^6$ or $R_{off}$ is equal to or greater than $10^7$.

In regard to the electroforming voltage, in some embodiments, the nanoporous $Ta_2O_{5-x}$ memory systems do not need any activating voltage to form the switching channel. Hence, the problematic Joule-heating-damage to the surrounding oxide-based memory material itself is mitigated, thereby leading to increases in the device yields and uniformity required for future commercial memory applications.

In various embodiments, known and diverse methods for making porous structures of metal oxides can be utilized to fabricate the nanoporous $Ta_2O_{5-x}$ memory systems. Therefore, there is much potential in terms of the design of the materials and structures to improve the switching performance and the processing method.

FIG. 1A shows a schematic of a nanoporous (NP) memory system. A nanoporous memory system may provide a substrate 10, bottom electrode (BE) 20, non-porous layer 30, nanoporous layer 40 and top electrode(s) (TE) 50. The BE 20 may be position on the substrate 10, and the non-porous layer 40 may be positioned on the BE 20. The NP layer 40 may be positioned on the non-porous layer 30. Lastly, the TE 50 may be positioned on the NP layer 40. While the TE 50 are shown as islands, other embodiments may utilize and suitable arrangement or pattern. Notably, the non-porous layer 30 and NP layer 40, which provide the switching mechanism, are sandwiched between the TE 50 and BE 20. As a nonlimiting example of a memory system, the substrate may be a Si substrate coated with $SiO_2$, the bottom electrode may be Pt, the non-porous layer may be Ta, the porous layer may be $Ta_2O_{5-x}$, and the top Pt/MLG.

FIG. 1B shows an illustrative SEM image for porous material on the top of the junction. FIG. 1C shows a nonlimiting example of I-V switching behavior of the nanoporous $Ta_2O_{5-x}$ memory. In some embodiments, a $½V_{read}$ scheme may be utilized, and the sneak current may be determined at $½V_{read}$. In some embodiments, the on-off ratio is ~ equal to 100 or higher. In some embodiments, the memory is capable of being switched between ON/OFF states with a current equal to or less than 100 µA. In some embodiments, the memory is capable of being switched between ON/OFF states with a current equal to or less than 50 µA. In some embodiments, the memory is capable of being switched between ON/OFF states with a current equal to or less than 10 µA.

For comparison, FIG. 2 illustrates bipolar I-V switching of a non-porous $Ta_2O_{5-x}/TaO_{2-y}$ memory. Notably, the ON-OFF ratio of this non-porous memory is significantly lower than a NP memory system at ~5.

Notably, the nanoporous memory system relatively simple structure allows for a large variety of methods to be utilized. Various methods may be utilized to make the nanoporous metal oxide and metal chalcogenide memory systems (e.g., nanoporous tantalum oxide ($Ta_2O_{5-x}$) memory systems). Nonlimiting fabrication procedures for making such memory systems are outlined below with reference to nanoporous tantalum oxide ($Ta_2O_{5-x}$) memory systems. However, it shall be understood that such methods also apply to other nanoporous metal oxide and metal chalcogenide memory systems.

1. The nanoporous $Ta_2O_{5-x}$ cells may be fabricated on p-type (100) Si wafers (1.5 cm×1.5 cm) covered with thermally grown 300 nm-thick $SiO_2$.

2. A Pt bottom electrode may be deposited on the substrate by sputtering, e-beam evaporation or any other suitable deposition process after a cleaning process with acetone, isopropyl alcohol, and deionized (DI) water by ultrasonication (bath) for 3 min.

3. Then, Ta (100-200 nm) may be deposited on the bottom electrode by using sputtering, e-beam evaporation or any other suitable deposition process.

4. The nanoporous $Ta_2O_{5-x}$ layer may be anodically grown in a solution of sulfuric acid (95 to 98%, Sigma-Aldrich) with 1 vol % HF (49%, Fisher Scientific) and 4 vol % $H_2O$ at 50 V for a few tens of seconds. Experiments were carried out at room temperature in a two electrode set-up with platinum gauze as a counter electrode. After anodization, the samples were rinsed with $H_2O$ followed by drying under a flow of air.

5. Single or multi-layer graphene may be transferred onto the top of $Ta_2O_{5-x}$ layer to prevent the penetration of the top Pt electrode into the nanopore regions of $Ta_2O_{5-x}$ layer. There are other nongraphene-based methods that could be used to prevent this penetration, such as deposition of a more refractory metal or deposition using a cold-stage to cool the substrate.

6. Using a photo-mask or shadow metal mask method, the top Pt-electrode may be deposited on the patterned area.

7. Finally, reactive-ion etching (RIE) may be performed to remove part of the $Ta_2O_{5-x}$ layer and to expose the bottom Pt electrode for making contact to the probe.

The methods and systems can have numerous variations. In some embodiments, the active metal or metal oxides in a memory system could be varied. As a nonlimiting example, the active materials may be a metal oxide or metal chalcogenide and a corresponding active metal. In some embodiments, the thickness and the deposition methods of the active metal or metal oxides in the memory system could also be varied. In some embodiments, the processing temperature can be varied for optimum performance. In some embodiments, the methods for making nanopores, such as physical and chemical processes can be varied for optimum performance. In some embodiments, the pore sizes, the porosity, and the junction area can be varied for optimum performance. In some embodiments, the concentration of electrochemical etching solutions, its duration, and the applied voltage can be varied for optimum junction structures. In some embodiments, a stacking layer such as double nanopore metal-oxide layers can be utilized or applied for the desirable switching performance. In some embodiments, chemical and physical treatments on active material surfaces can be varied to obtain optimum performances for switching. In some embodiments, oxygen vacancies or atomic ratio between metal and oxide can be varied to obtain the optimum performance from the memories. In some embodiments, the feature size and form of the cells can be varied to obtain optimum performance from the memories. In some embodiments, multi-bit storage capability can be obtained in a nanoporous memory unit. In some embodiments, the memory unit provides 0, 1, 2, 3 and even 4 or higher number of states. In some embodiments, a multi-stacking structure (e.g., 3D from stacked 2D where D stands for "dimensional") can be utilized in a nanoporous metal-oxide memory for ultra-dense memory arrays. In some embodiments, the protecting layer (in the nonlimiting examples discussed previously—graphene) can be varied to get desirable switching performances that include any chemical treatment on the protecting layer or the replacement of graphene for mitigating metal leakage into the porous layer. In some embodiments, any suitable substrate (e.g. rigid or flexible) can be used. In some embodiments, any metal oxide or metal chalcogenide can be used. In some embodiments, mixtures of metal oxides or mixtures of metal chalcogenides, or mixtures of metal oxides and chalcogenides can be used. Various methods may be utilized to make pores in the nanoporous tantalum oxide (e.g., $Ta_2O_{5-x}$) memory. For instance, in some embodiments, pores can be made by plasma-enhanced chemical vapor deposition (PECVD), template-assisted deposition of anodic aluminum oxide (AAO), solgel methods.

A new design for an ultrahigh-density nonvolatile resistive memory using a three-dimensional (3D) networked nanoporous (NP) metal oxide or metal chalcogenide material that can be fabricated at room temperature is discussed herein. The devices show excellent selector-less memory behavior while having a much higher I-V non-linearity than other selector-less memory systems. A nonlimiting $Ta_2O_{5-x}$ example of the memory device showed the potential to achieve up to a 162 Gbit crossbar array that would meet industrial requirements for highly scaled devices, which is much higher than other oxide-based memory systems. Using this 3D networked NP $Ta_2O_{5-x}$, the non-linearity value can be dramatically increased. A facile method to fabricate the resistive memory is shown without the necessity for integrating additional selectors.

FIGS. 3A-3G respectively show (A) a schematic nonlimiting illustration of the cells in a NP $Ta_2O_{5-x}$ memory device; (B) inset—the cross-sectional SEM image at the middle of the cell; (C) a top view of SEM image of the NP $Ta_2O_{5-x}$ film; (D) a wide-area cross-sectional image formed by joining eight high-resolution SEM images (the boxes in the middle of FIG. 3D correspond to the different materials detected in the SEM image for each region); (E) a series of cross-sectional SEM images at intervals of 30-50 nm as functions of length (L), thickness (T), and width (W); (F) 3D reconstructed topology of NP $Ta_2O_{5-x}$ junction structure, by the cross-sectional SEM images; and (G) The XPS depth-profiling analysis of the Ta 4f spectra for NP $Ta_2O_{5-x}$ film.

Figures 3A, 3B, 3C, 3D:
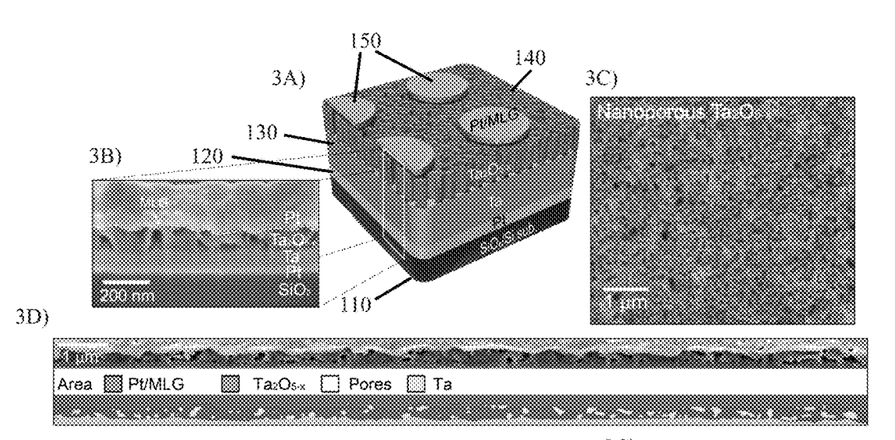
FIGS. 3A-3G show an illustrative example of (a) a NP memory device, (b) SEM image of the middle of a memory cell, (c) top view SEM image, (d) cross-sectional SEM image, (e) series of SEM images, (f) 3D reconstructed topology, and (g) XPS depth profiling analysis.

FIGS. 3A-3B show a schematic diagram of a 3D networked NP $Ta_2O_{5-x}$ memory cell and a cross-sectional scanning electron microscope (SEM) image at the middle of the cell representative of cells utilized in experimental work discussed further herein. A NP $Ta_2O_{5-x}$ memory cell may provide a $SiO_x$/Si substrate 110, Pt bottom electrode 120, Ta non-porous layer 130, NP $Ta_2O_{5-x}$ layer 140 and Pt/MLG top electrode(s) 150. The nonlimiting example shown is a NP $Ta_2O_{5-x}$ memory cell with multi-layer graphene (MLG). However, it shall be understood that this nonlimiting example is solely provided for purposes of illustrating experimental examples discussed further herein, and other embodiments may provide a different metal oxide or metal chalcogenide material.

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Figures 3E, 3F, 3G:
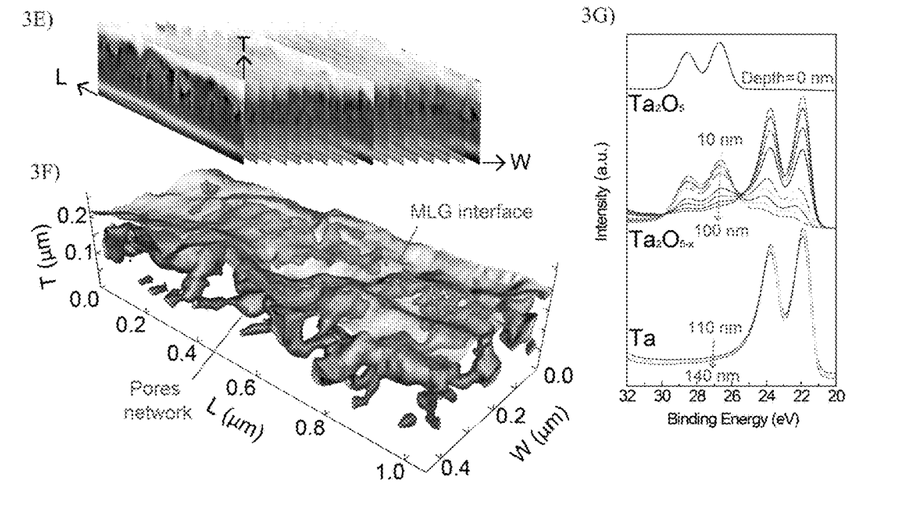
Figure 4:
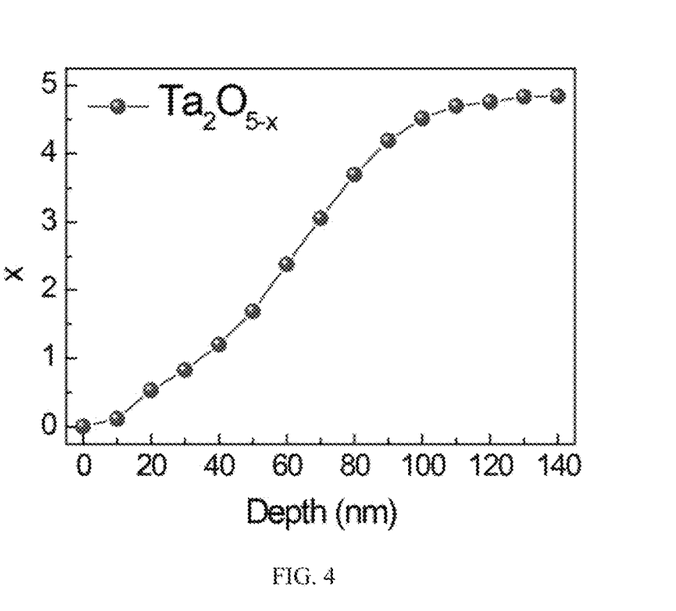
FIG. 4 shows a plot of x for a NP $Ta_2O_{5-x}$ film as a function of depth.

As a nonlimiting example, the manufacturing process for an experimental example is described below. After the deposition of Ta (200 nm)/Pt (30 nm) on a $SiO_2$/Si wafer by sputtering, the NP $Ta_2O_{5-x}$ (100 nm thick) was formed by anodization in a solution of sulfuric acid (95 to 98%, Sigma-Aldrich) with 0.2 vol % HF (49%, Fisher Scientific) and 3 vol % $H_2O$ at 50 V for 20 s in a two electrode set-up with platinum gauze as a counter electrode. The SEM image shows that the $Ta_2O_{5-x}$ nanopores have a pore radius size distribution from 2 to 100 nm (FIG. 1b). After anodization, the MLG (~10 layers grown on Cu) was transferred atop the device substrate for two reasons: first, it forms a Schottky-like barrier with the $Ta_2O_{5-x}$ due to the band alignment. Second, it effectively eliminates the formation of metal filaments through the NP layer (FIGS. 3A and 3D). The average porosity value in the NP layer was ~19%, estimated by the area ratio of the pores (lighter color) to the $Ta_2O_{5-x}$ regions (darker color) within a sufficiently wide cross-sectional area of the cell compared to the scale of pores (FIG. 3D). The Pt metal (50 nm) was deposited atop the MLG/NP $Ta_2O_{5-x}$ layer through a 100 µm radius shadow mask. An oxygen plasma process was subsequently performed to remove the exposed MLG region. All fabrication processes were carried out at room temperature (300 K). In order to elucidate the junction topology, focused ion beam (FIB) tomography was performed by milling out the junction with slice thicknesses of 30 to 50 nm and taking cross-sectional SEM images at every milling step (FIG. 3E). Based on the contrast among pores for Pt/MLG and $Ta_2O_{5-x}$ in these SEM images (FIG. 3E), the 3D junction structure was reconstructed (FIG. 3F). The internal pores were partially inter-connected and randomly distributed (FIG. 3E). Another interesting aspect is that the oxygen percentage of $Ta_2O_{5-x}$ varied according to its depth, confirmed by the depth-profiling X-ray photoelectron spectroscopy (XPS) analysis with timed $Ar^+$ bombardment and through the Ta 4f spectra (FIG. 3G). Due to the oxidation during the anodizing process, the oxygen ratio in $Ta_2O_{5-x}$ continually decreased as the depth was increased, and it approached that of pure Ta metal at a depth of ~110 nm (FIG. 3G and FIG. 4). The change of the percentages of the oxide species in $Ta_2O_{5-x}$ leads to a distribution of TaO, $TaO_2$, and $Ta_2O_5$ species in the material. Therefore, the $Ta_2O_{5-x}$ layer forms a relative oxygen vacancy ($V_o$) poor/$V_o$ rich structure depending on its depth, so that the switching could be achieved through the $V_o$ movement between two component layers by the applied voltage polarities. FIG. 4 shows the plot of the 'x' of the NP $Ta_2O_{5-x}$ film as a function of its depth, which can be estimated from Ta and O atomic concentrations.

FIGS. 5A-5G respectively show (a) the representative I-V characteristics of the NP $Ta_2O_{5-x}$ device (b) with the electric circuit array for $V_r/3$ scheme; (c) the contour plot of the calculated resistance R as functions of the applied voltage and the number of devices (Inset shows the representative R-V curve); (d) the contour plot of the calculated non-linearity value ($R_{sneak}^F/R_{on}^F$) as functions of the applied voltage and the number of devices; (e) the ON-OFF ratio ($R_{off}^F/R_{on}^F$) as a function of the number of devices; (f) endurance cycling test of the selected NP $Ta_2O_{5-x}$ device for $2 \times 10^3$ cycles; and (g) the linear relationship of $V_{min}$-$V_{set}$ curve (Inset shows $V_{min}$ shifts when the applied voltage is increased).

Figures 5A, 5B:
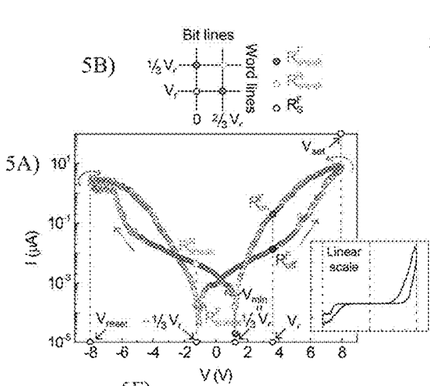
FIGS. 5A-5G show (a) I-V characteristics of a representative NP memory, (b) electric circuit array for $V_r/3$ scheme, (c) contour plot of calculated resistance as a function of applied voltage and number of devices (inset representative R-V curve), (d) contour plot of calculated non-linearity value ($R_{sneak}^F/R_{on}^F$) as a function of applied voltage and number of devices, (e) ON-OFF ratio ($R_{off}^F/R_{on}^F$) as a function of the number of devices, (f) endurance cycling test, and (g) linear relationship of $V_{min}$-$V_{set}$ curve (Inset $V_{min}$ shift with increase in applied voltage)

FIGS. 5A-5G describe the switching characteristics for the two-terminal NP $Ta_2O_{5-x}$ memory. In FIG. 5A, a switching diode I-V behavior is observed with the ON ($R_S^F = R_{on}^F$) and the OFF resistance ($R_S^F = R_{off}^F$) at a forward read voltage ($V_r$) controlled by different bias polarities of set voltage ($V_{set}$) and reset voltage ($V_{reset}$). Interestingly, the minimum currents of the switching I-V plot exist at a certain positive and negative voltage, not at the zero voltage. This indicates that the electric field through the NP $Ta_2O_{5-x}$ layer becomes a minimum value when a certain voltage is applied, hence the charge transfer could be mostly suppressed (vide infra).

In order to read out the exact data in the crossbar array, various voltage schemes for the readout process can be chosen according to the memory integration types. For example, the 1D-1R array only operates in the "$V_r$ scheme", where the word and bit lines for a selected cell are biased to $V_r$ and 0 V, respectively, while all the unselected lines are floated. In the case of 1S-1R, CRS, and the selector-less resistive memory, they can be operated in either the "$V_r/2$ scheme" or the "$V_r/3$ scheme". The common point for these integration types is that they exhibit a lowered current at $V_r/2$ or $V_r/3$ due to their nonlinear I-V behavior (FIG. 5B). The non-linearity is defined as the current (or resistance) ratio between $V_r$ and $V_r/2$ (or $V_r/3$) when the cell is in the ON-state. When the non-linearity become very large, it can reduce the uncertainty of the unwanted misreading of the switching state in the crossbar array to an extremely low value. In the $V_r/2$ scheme, $V_r/2$ is applied to all the unselected word/bit lines, while the $V_r/3$ scheme requires a relatively complicated circuitry where the unselected lines were biased to $V_r/3$ for word and to $2V_r/3$ for bit lines. For a selected cell for both schemes, the selected lines were biased to $V_r$ and 0 V (ground). Depending on the voltage schemes, the unselected cells experience only a maximum of $V_r/2$ in $V_r/2$ scheme or $V_r/3$ in $V_r/3$ scheme, hence the reading disturbance by sneak current through the $V_r/3$ scheme is less severe.

Figures 6A, 6B:
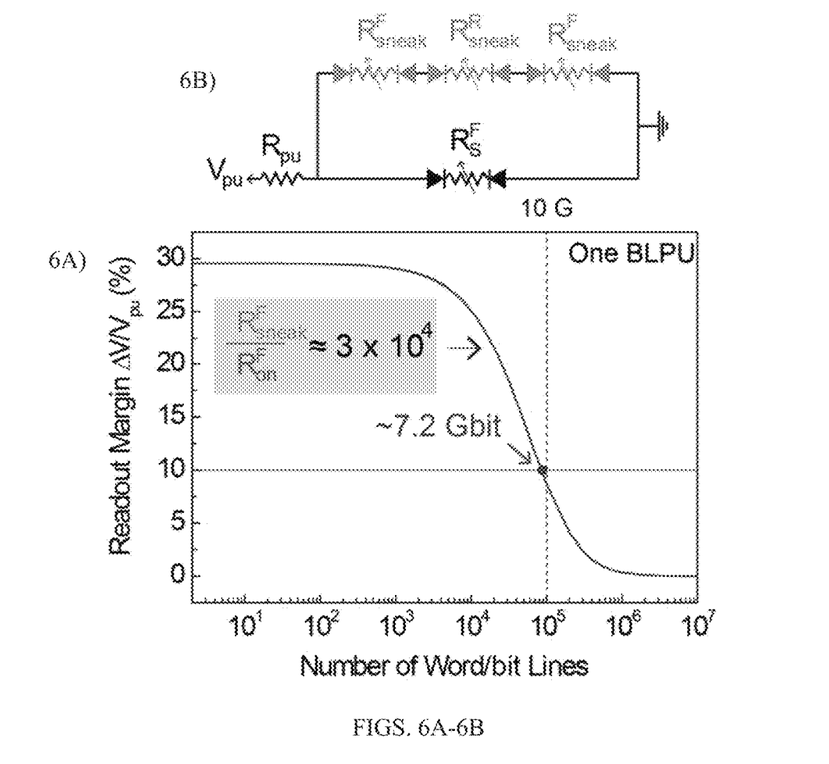
FIGS. 6A-6B show (a) calculated readout margin $\Delta V/V_{pu}$ as a function number of word/bit lines, and (b) a crossbar array equivalent circuit.

Under the $V_r/3$ scheme (FIG. 5B), the total resistance for the sneak current in the NP $Ta_2O_{5-x}$ memory can be determined by the sum of resistances at unselected cells that are defined as 2 $R_{sneak}^F + R_{sneak}^R$ in 2×2 array. When the voltage position for maximum resistance is defined as $V_r/3$ (1.2 V), the ON-OFF ratio at $V_r$ (3.6 V) is slightly higher than 10 (FIG. 5A). The non-linearity value in FIG. 5A ($R_{sneak}^F/R_{on}^F$) is found to be more than $10^4$, which allows them to extend to >7 Gbit crossbar array (see FIG. 6A-6B). FIG. 6A shows the calculated readout margin $\Delta V/V_{pu}$ as a function word/bit lines for a NP $Ta_2O_{5-x}$ memory device under $V_r/3$ scheme. All resistance values are calculated from the linear fit of the I-V data (FIG. 5A). We assumed a "worst-case scenario", the one bit-line pull-up (One BLPU). FIG. 6B shows a crossbar array equivalent circuit.

Figure 5C:
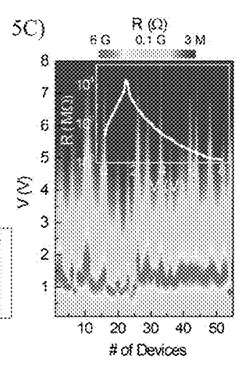
Figure 5D:
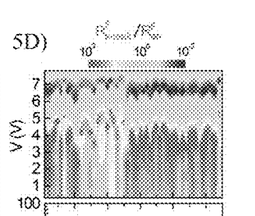
Figure 5E:
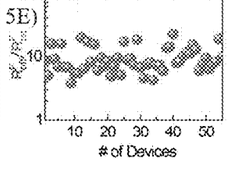
Figure 5F:
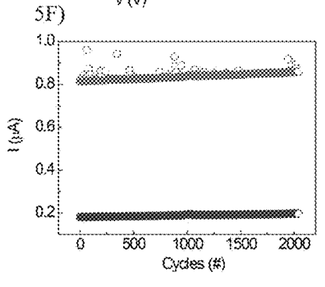

In order to evaluate the uniformity of switching in the NP $Ta_2O_{5-x}$ memory, the resistances, the non-linearity, and the ON-OFF ratios of ~55 devices was statistically investigated (FIGS. 5C-5E). After applying the $V_{set}$=8 V and sweeping from 8 to 0 V, the resistances were calculated from the linear fit of I-V data for each device, as shown in the contour plot in FIG. 5C. It was found that the maximum resistances (~10 G$\Omega$) in forward bias appear in the voltage range from 1.2 to 1.7 V (FIG. 5C) defining $R_{sneak}^F$ at $V_r/3$ scheme, a representation of which is shown as the inset of FIG. 5C. The average $V_r$ for maximum non-linearity is ~4.25±0.30 V and the average non-linearity is ~$1.8 \times 10^3$ (FIG. 5D). The ON-OFF ratio at this $V_r$ was found to be ~9.53±4.37, which is similar to that of other $Ta_2O_5$ memories (FIG. 5E). This means that the NP $Ta_2O_{5-x}$ memory can switch without significant loss of its ON-OFF ratio. However, the set/reset currents at the operation voltages are much lower than that of other $Ta_2O_5$ memories by a factor of up to $10^2$, suggesting its promising potential for an ultralow power memory. It is believed, without the intent to be bound by theory, that the variation of the pore structure, depending on the porosity and pore size, is one cause of the fluctuations in the switching parameters. In FIG. 5F, structures show good endurance during 2000 cycles without any significant fluctuation of the states. The conduction states were programmed to be set by a writing pulse of 8 V and reset by an erasing pulse of −8 V during 500 immediately followed by the reading process at 4.2 V.

Figure 5G:
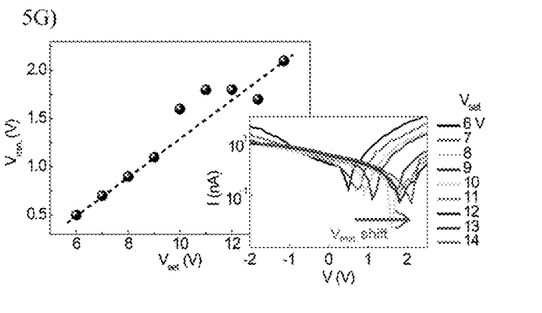

FIG. 5G shows the voltage position ($V_{min}$) for a minimum current (or maximum resistance) of a NP $Ta_2O_{5-x}$ memory as a function of the applied $V_{set}$. An apparent linear relationship between $V_{min}$ and $V_{set}$ was observed, which means it can be switched using different operating voltage regimes and give a wider range of switching characteristics in power consumption and ON-OFF ratios (see FIGS. 7A-7C). FIGS. 7A-7C show (a) the representative I-V characteristics of the NP $Ta_2O_{5-x}$ device with different set voltages (8 and 14 V); (b) the ON/OFF ratio and (c) ON power as a function of different set voltages. When the $V_{set}$ was increased, the $V_{min}$ increased while the minimum current remained mostly unaffected (inset of FIG. 5G). This linear relationship supports the idea that the switching mechanism is related to the presence of oxygen ions in the pores, depending on the external electric field. Higher $V_{set}$ could drive more oxygen ions to the relatively $V_o$ poor part of the pores. The negatively charged oxygen ions could produce an internal electric field that could balance with the external electric field at a certain voltage point. This indicates that the minimum currents through the NP $Ta_2O_{5-x}$ memory may exist at a certain voltage point, not at zero voltage.

Figures 8A, 8B, 8C, 8D:
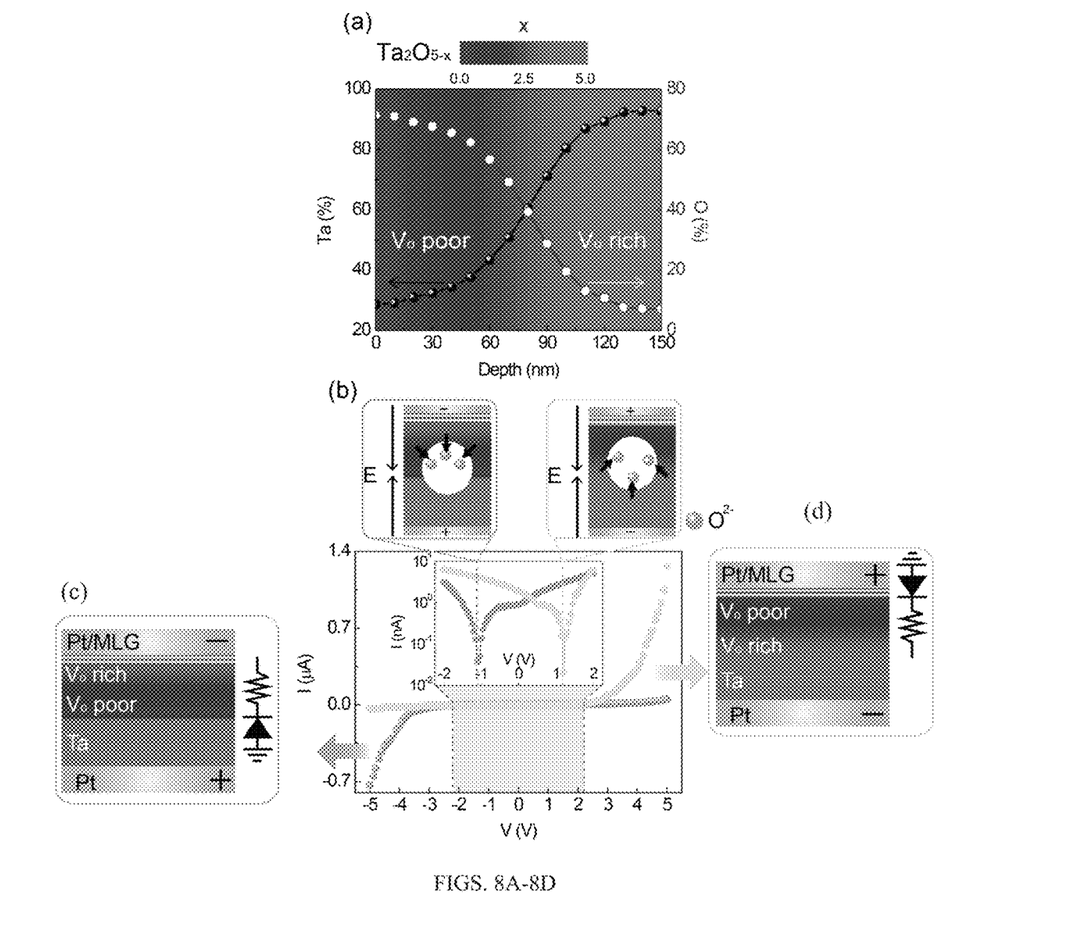
FIGS. 8A-8D show (a) plots of the Ta and O atomic concentrations as a function of the depth, (b) the switching diode behaviour when the applied voltage is changed, and (c-d) schematics that indicate the junction structures with the different distribution of $V_o$ when a positive or negative voltage at the electrode/NP layer interface is initially applied.

FIGS. 8A-8B respectively show (a) the plots of the Ta (left) and O (right) atomic concentrations as a function of the depth of the $Ta_2O_{5-x}$ film. Inset shows the contour plot of the calculated oxygen ratio as a function of its depth, which can form a relative $V_o$ poor/$V_o$ rich structure; and (b) the switching diode behaviour when the applied voltage is changed from 5 V to −5 V or from −5 V to 5 V with the equivalent circuits of Pt/MLG/NP $Ta_2O_{5-x}$/Ta junction structures. FIGS. 8C-8D show schematic that indicate the junction structures with the different distribution of $V_o$ when a positive or negative voltage at the interface of the Pt/MLG/NP $Ta_2O_{5-x}$ is initially applied, respectively. The inset in FIG. 8B shows the enlarged semilog plot of I-V at the low bias regime under different voltage polarities. The top schematics of FIG. 8B indicate the junction structure with the negative oxygen ions in the pores driven by the electric field. The negative oxygen ions can be driven until the electric field across the junction is offset.

To better understand the switching mechanism behind the switching diode behavior and the presence of minimum current at a certain voltage, a contour plot was constructed of the estimated oxygen ratio for $Ta_2O_{5-x}$ as a function of its depth based on measured Ta and O atomic concentrations by XPS profiling analysis (FIG. 8A). Since the oxygen ratio is inversely proportional to the $V_o$, the $V_o$ was gradually increased when the NP $Ta_2O_{5-x}$ was deeper, thereby separating the $V_o$ poor and $V_o$ rich areas in the film (FIG. 8A). In the bias regime from −5 to 5 V, contour plots clearly exhibited the change of rectifying direction according to the sweep direction of applied voltage (FIG. 8B), which indicates the polarity switch of the Schottky diode. This switchable diode behavior can be understood by the Schottky-like barrier modulation induced by the $V_o$ exchange from one interface to the opposite interface and vice versa, depending on the bias polarity and its magnitude. When $V_o$ is concentrated at one end of the NP $Ta_2O_{5-x}$, an Ohmic-like contact can be formed due to the relatively low contact barrier, and then they established asymmetric contacts with a Schottky-like contact at the another interface. In a low bias regime (V<|2|V), the current rises to a minimum value at certain voltages. It is believed, without being bound by theory, that the negatively charged oxygen ions could be pulled from the surface of the pores and confined to pores when the voltage is applied, which affects the strength of electric field across the NP $Ta_2O_{5-x}$. When the electric field induced by oxygen ions matches the external electric field, the transport charges are difficult to move, causing a minimum current at certain voltages, as shown in the top schematics of FIG. 8B. Therefore, higher set voltages $V_{set}$ are the cause of an increase in $V_{min}$, which explains the linear relationship of the $V_{min}$-$V_{set}$ plot in FIG. 5G.

Figures 9A, 9B:
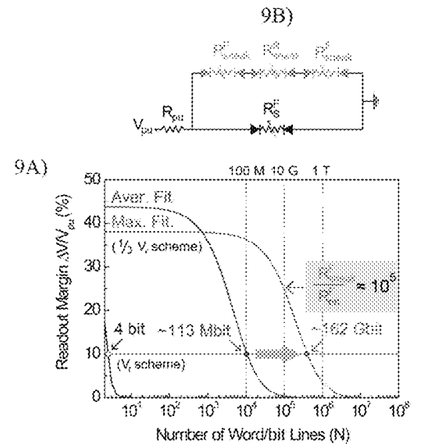
FIGS. 9A-9C show (a) calculated readout margin $\Delta V_{out}/V_{pu}$ as a function of the number of word/bit lines, (b) a crossbar array equivalent circuit, and (c) bits size for a NP $Ta_2O_{5-x}$ memory system, other integrated architectures, and selector-less memory systems under $V_r/2$ scheme and $V_r/3$ scheme.
Figure 9C:
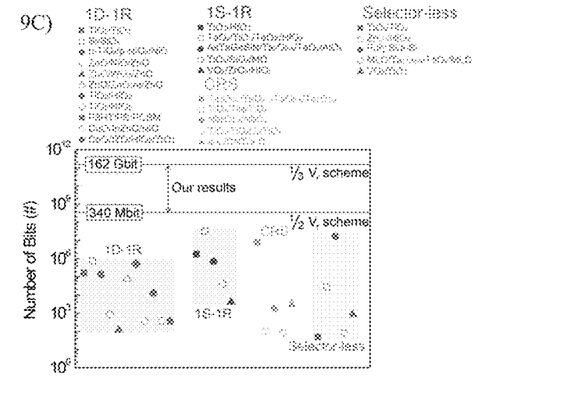

FIG. 9A shows calculated readout margin $\Delta V_{out}/V_{pu}$ as a function of the number of word/bit lines for NP $Ta_2O_{5-x}$ memory system under $V_r$ scheme and $V_r/3$ scheme. The lines indicate the result of the readout margins that are calculated based on the average or maximum non-linearity value of the NP $Ta_2O_{5-x}$ memory system. FIG. 9B shows a crossbar array equivalent circuit. FIG. 9C shows the maximum size of bits for the NP $Ta_2O_{5-x}$ memory system under $V_r/2$ scheme and $V_r/3$ scheme and for other integrated architectures such as 1D-1R, 1S-1R, CRS, and selector-less memory systems under $V_r$ scheme or $V_r/2$ scheme.

The readout margin simulation determines the maximum size of the array. FIG. 9A shows the calculated readout margin of the NP $Ta_2O_{5-x}$ memory with various voltage schemes using the crossbar array equivalent circuits (FIG. 9B). A "worst-case scenario" was assumed where all unselected cells were ON-states with negligible line resistances, incurring maximum disturbance in reading process, the so-called one bit-line pull-up (One BLPU). Under this circumstance, the voltage drop ($\Delta V$) difference across the pull-up resistor ($R_{pu}$) in the crossbar array can be used to distinguish between the ON- and OFF-states of the selected cell. Generally, $\Delta V/V_{pu}$ (pull-up voltage)=10% has been known as a minimum criterion to differentiate their switching state, which can provide the maximum number (N) of its word/bit lines using the resistor voltage divider eq 1 as follows, $$\frac{\Delta V}{V_{pu}} = \frac{R_{pu}}{\left[R_{on}^F \middle\| \left(\frac{2R_{sneak}^R}{(N-1)} + \frac{R_{sneak}^F}{(N-1)^2}\right)\right] + R_{pu}} - \frac{R_{pu}}{\left[R_{off}^F \middle\| \left(\frac{2R_{sneak}^R}{(N-1)} + \frac{R_{sneak}^F}{(N-1)^2}\right)\right] + R_{pu}} \quad (1)$$

Figure 10:
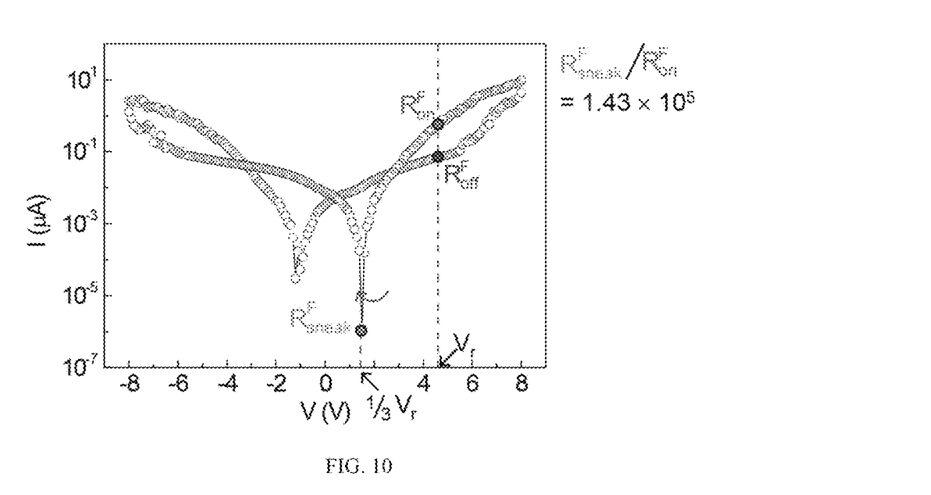
FIG. 10 shows the I-V characteristics of a NP device with the highest non-linearity.

In this case, the $R_{sneak}^F$ and $R_{sneak}^R$ at unselected cells can determine the total resistance through sneak paths, which can be obtained from the I-V curves by the linear fittings. Assume that the resistance of the $R_{pu}$ was set to $R_{on}^F$ at $V_r$ (4.5 V) to achieve the maximum readout margin. Depending on the voltage schemes, the allowed maximum number of crossbar array would be significantly increased from 4 bit for $V_r$ scheme and 113 Mbit for $V_r/3$ scheme on average (FIG. 9A). If the experimental I-V data having a highest non-linearity close to ~$10^5$ is chosen, the NP $Ta_2O_{5-x}$ memory can be further scaled up to a ~162 Gbit crossbar array (FIG. 9A and FIG. 10). FIG. 10 shows the I-V characteristic of the NP $Ta_2O_{5-x}$ device with highest non-linearity. The non-linearity is ~$1.43 \times 10^5$. FIG. 9C shows the comparison of the calculated the maximum number of bits for various kinds of integrated architectures such as 1D-1R, 1S-1R, CRS, and selector-less memory based on their best I-V plots, respectively (See Table. 1). Table 1 below show a summary of switching parameters for various integration architectures such as 1D-1R, 1S-1R, CRS, and selector-less memory. The resistances for ON, OFF, and sneak and the maximum readout margin for each architecture are summarized.

TABLE 1

Switching Parameters for Various Integration Architectures

| Integration architectures | Switching Materials | Max. Number of Bits | $R_{off}$ | $R_{on}$ | $R_{sneak}$ | Ref. (#) |
|---|---|---|---|---|---|---|
| 1Diode-1Resistor (1D-1R) | $TiO_2/TiO_2$ | $1.67 \times 10^5$ | $1.25 \times 10^5$ | $2.00 \times 10^3$ | $2.00 \times 10^8$ | 1 |
| | $Si/SiO_x$ | $7.53 \times 10^5$ | — | $2.33 \times 10^6$ | — | 2 |
| | n-$TiO_x$/p-$NiO_x$/NiO | $1.36 \times 10^5$ | $1.00 \times 10^6$ | $1.00 \times 10^3$ | $8.00 \times 10^7$ | 3 |
| | ZnO/NiO/ZnO | $8.42 \times 10^2$ | $1.00 \times 10^4$ | $2.00 \times 10^2$ | $1.00 \times 10^6$ | 4 |

TABLE 1-continued

Switching Parameters for Various Integration Architectures

| Integration architectures | Switching Materials | Max. Number of Bits | $R_{off}$ | $R_{on}$ | $R_{sneak}$ | Ref. (#) |
|---|---|---|---|---|---|---|
| | $ZnO/WO_3/ZnO$ | $1.21 \times 10^2$ | $1.43 \times 10^3$ | $1.00 \times 10^2$ | $1.25 \times 10^5$ | 4 |
| | $ZnO/ZnO$: $Al/ZnO$ | $7.84 \times 10^4$ | $1.67 \times 10^4$ | $2.10 \times 10^2$ | $1.80 \times 10^4$ | 5 |
| | $TiO_2/HfO_2$ | $5.13 \times 10^5$ | $5.00 \times 10^5$ | $1.00 \times 10^3$ | — | 6 |
| | $TiO_2/HfO_2$ | $3.61 \times 10^2$ | $2.50 \times 10^7$ | $5.00 \times 10^4$ | $1.00 \times 10^7$ | 7 |
| | P3HT/PS: PCBM | $1.28 \times 10^4$ | $1.00 \times 10^9$ | $1.67 \times 10^5$ | $1.25 \times 10^9$ | 8 |
| | $CuO/InZnO/NiO$ | $3.61 \times 10^2$ | $5.00 \times 10^5$ | $5.00 \times 10^3$ | $1.00 \times 10^6$ | 9 |
| | $CoO/IZO/HfO_2/ZrO_2$ | $3.61 \times 10^2$ | $1.11 \times 10^5$ | $1.67 \times 10^3$ | $3.33 \times 10^5$ | 10 |
| 1Selector-1Resistor (1S-1R) | $TiO_2/HfO_2$ | $1.77 \times 10^6$ | $1.60 \times 10^6$ | $3.00 \times 10^4$ | $1.20 \times 10^7$ | 11 |
| | $TaO_x/TiO_2/TaO_x/HfO_2$ | $3.19 \times 10^7$ | $1.50 \times 10^6$ | $6.00 \times 10^3$ | $1.00 \times 10^7$ | 12 |
| | $AsTeGeSiN/Ta_2O_{5-x}/TaO_y/AlO_2$ | $6.87 \times 10^5$ | $7.50 \times 10^5$ | $3.00 \times 10^4$ | $1.50 \times 10^6$ | 13 |
| | $TiO_x/SiO_x/MO$ | $4.00 \times 10^4$ | — | $1.78 \times 10^4$ | — | 14 |
| | $VO_2/ZrO_x/HfO_x$ | $4.10 \times 10^3$ | — | $1.00 \times 10^3$ | — | 15 |
| Complementary Resistive Switch (CRS) | $Ta_2O_{5-x}/TaO_{2-x}$—$Ta_{2-x}/Ta_2O_{5-x}$ | $7.56 \times 10^6$ | $2.50 \times 10^5$ | $6.67 \times 10^4$ | $8.33 \times 10^7$ | 16 |
| | $TiO_x/TiN/TiO_x$ | $1.00 \times 10^2$ | $1.40 \times 10^2$ | $4.67 \times 10^1$ | $2.33 \times 10^2$ | 17 |
| | $Nb_2O_{5-x}/NbO_y$ | $1.76 \times 10^3$ | — | $2.50 \times 10^3$ | — | 18 |
| | $TiO_x/TiO_xN_y/TiO_x$ | $8.10 \times 10^1$ | $2.00 \times 10^2$ | $7.00 \times 10^1$ | $3.50 \times 10^2$ | 19 |
| | a-C/CNT/a-C | $3.14 \times 10^3$ | $2.50 \times 10^6$ | $1.43 \times 10^5$ | $2.50 \times 10^6$ | 20 |
| Selector (or Diode)-less Memory | $TiO_x/TiO_y$ | $4.90 \times 10^1$ | $1.67 \times 10^5$ | $3.33 \times 10^4$ | $8.33 \times 10^4$ | 21 |
| | $ZrO_x/HfO_x$ | $2.56 \times 10^4$ | — | $1.00 \times 10^3$ | — | 22 |
| | Poly Si/a-Si | $1.70 \times 10^7$ | $4.55 \times 10^{14}$ | $1.25 \times 10^7$ | $1.25 \times 10^{14}$ | 23 |
| | $MLG/Ta_2O_{5-x}/TaO_y/MLG$ | $8.10 \times 10^1$ | $1.75 \times 10^4$ | $4.00 \times 10^3$ | $1.40 \times 10^4$ | 24 |
| | $VO_2/TiO_2$ | $8.41 \times 10^2$ | $3.00 \times 10^5$ | $3.00 \times 10^4$ | $2.92 \times 10^5$ | 25 |
| | Nanoporous $Ta_2O_{5-x}$ | $1.62 \times 10^{11}$ | $6.59 \times 10^7$ | $3.94 \times 10^6$ | $1.28 \times 10^{12}$ | our result |

As shown in FIG. 9C, the maximum allowed number of bits for the NP $Ta_2O_{5-x}$ under $V_r/2$ scheme or $V_r/3$ scheme is much higher than any of these previous reported systems without a requirement of selectors and diodes, suggesting an ultrahigh density storage technology.

In summary, an oxide-based memory system using NP $Ta_2O_{5-x}$ has an excellent self-embedded highly nonlinear I-V switching behavior, which could be integrated up to ~162 Gbit, far beyond current architectures for two-terminal resistive memory. It can be fabricated at room temperature and consumes relatively low power when compared to other $Ta_2O_{5-x}$ memory devices. In addition, depending on the operating voltages, the location for $V_{min}$, the power consumption, and the ON-OFF ratio can be changed. The switching mechanism can be explained by a transformation from Schottky- to Ohmic-like characteristics at the interfaces of MLG/NP $Ta_2O_{5-x}$/Ta and vice versa, and the confined negatively charged oxygen ions in the pores. Results suggest that the NP $Ta_2O_{5-x}$ memory system could offer a new device platform for future ultrahigh density memory applications.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting the scope of the disclosure.

What is claimed is:

1. A memory system comprising:
at least one memory cell, wherein the at least one memory cell comprises,
  a substrate;
  a bottom electrode deposited on the substrate;
  a non-porous layer deposited on the bottom electrode;
  a nanoporous (NP) layer deposited on the non-porous layer, wherein the NP layer is a metal oxide or metal chalcogenide, and the all pores of the NP layer are unfilled; and
  a top electrode deposited on the NP layer, wherein the top electrode interfaces with the NP layer, and the non-porous layer and the NP layer are sandwiched between the bottom and top electrodes.

2. The system of claim 1, wherein the memory system is free of diodes, selectors, and transistors.

3. The system of claim 2, wherein the at least one memory cell further comprises an interlayer between the top electrode and the NP layer.

4. The system of claim 3, wherein the at least one memory cell consists of only the substrate, the bottom electrode, the non-porous layer, the nanoporous layer, the interlayer, and the top electrode.

5. The system of claim 1, wherein the NP layer is $Ta_2O_{5-x}$ where $0 \leq x < 5$.

6. The system of claim 1, wherein oxygen vacancies or chalcogenide vacancies in the NP layer increase towards the bottom electrode.

7. The system of claim 1, wherein pore radius sizes of pores of the NP layer are equal to or between 2-100 nm.

8. The system of claim 1, wherein the at least one memory cell is free from requiring an electroforming process.

9. The system of claim 1, wherein a positive or negative voltage pulse of 10 V or less sets/resets the at least one memory cell to ON/OFF states.

10. The system of claim 1, wherein the at least one memory cell is capable of being switched between ON/OFF states with a current equal to or less than 100 μA.

11. The system of claim 1, wherein $R_{on}$ is equal to or greater than $10^4$ or $R_{off}$ is equal to or greater than $10^5$.

12. The system of claim 1, wherein the at least one memory cell has an ON and OFF ratios with a factor of 5 or greater.

13. The system of claim 1, wherein the memory system has an array density of 100 or greater.

* * * * *